United States Patent
Glocker et al.

(10) Patent No.: US 6,497,803 B2
(45) Date of Patent: Dec. 24, 2002

(54) UNBALANCED PLASMA GENERATING APPARATUS HAVING CYLINDRICAL SYMMETRY

(75) Inventors: David A. Glocker, Rush, NY (US); Mark M. Romach, Spencerport, NY (US)

(73) Assignee: Isoflux, Inc., Rush, NY (US)

( * ) Notice: Subject to any disclaimer, the term of this patent is extended or adjusted under 35 U.S.C. 154(b) by 0 days.

(21) Appl. No.: 09/805,331

(22) Filed: Mar. 13, 2001

(65) Prior Publication Data

US 2001/0050225 A1 Dec. 13, 2001

Related U.S. Application Data

(60) Provisional application No. 60/208,153, filed on May 31, 2000.

(51) Int. Cl.[7] .................. C23C 14/35; C23C 16/00; C23F 1/02
(52) U.S. Cl. ............... 204/298.21; 204/298.12; 204/298.18; 156/345.38; 118/723 R; 118/723 MP
(58) Field of Search .................. 204/298.12, 298.16, 204/298.18, 298.21; 156/345, 345.38; 118/723 R, 723 MP

(56) References Cited

U.S. PATENT DOCUMENTS

| | | | |
|---|---|---|---|
| 3,884,793 A | 5/1975 | Penfold et al. | 204/298 |
| 3,995,187 A | 11/1976 | Penfold et al. | 313/376 R |
| 4,030,986 A | 6/1977 | Shinskey | 203/2 |
| 4,031,424 A | 6/1977 | Penfold et al. | 313/146 |
| 4,041,353 A | 8/1977 | Penfold et al. | 315/267 |
| 4,111,782 A | 9/1978 | Penfold et al. | 204/298 |
| 4,116,793 A | 9/1978 | Penfold et al. | 204/192 R |
| 4,116,794 A | 9/1978 | Penfold et al. | 204/192 R |
| 4,132,612 A | 1/1979 | Penfold et al. | 204/192 R |
| 4,132,613 A | 1/1979 | Penfold et al. | 204/192 R |
| 5,047,131 A * | 9/1991 | Wolfe et al. | 204/192.23 |
| 5,196,105 A | 3/1993 | Feuerstein et al. | 204/298.13 |
| 5,556,519 A | 9/1996 | Teer | 204/192.12 |
| 5,563,734 A * | 10/1996 | Wolfe et al. | 359/360 |

OTHER PUBLICATIONS

"A complex–type focussed magnetron for sputtering", Sixiao et al., Nuclear Science and Techniques, vol. 5, No. 2, May 20, 1994.*
"Reactive alternating current magnetron sputtering of dielectric layers", Scherer et al., 1991.*
B. Window and N. Savvides, Charged particle fluxes from planar magnetron sputtering sources, 1986 American Vacuum Society, J. Vac. Sci. Technol. A, vol. 4, No. 2, pp. 196–202, Mar./Apr. 1986.
B. Window and N. Savvides, Unbalanced dc magnetrons as sources of high ion fluxes, 1986 American Vacuum Society, J. Vac. Sci. Technol. A, vol. 4, No. 3, pp. 453–456, May/Jun. 1986.

* cited by examiner

Primary Examiner—Steven H. VerSteeg
(74) Attorney, Agent, or Firm—Neal L. Slifkin; Harris Beach LLP

(57) ABSTRACT

Apparatus for creating subatmospheric high plasma densities in the vicinity of a substrate in a work space for use in magnetron sputter deposition aided by ion bombardment of the substrate. Unbalanced flux lines emanating from cylindrical or frusto-conical targets cannot be captured across the work space, because the energizing magnets are cylindrical, and instead converge toward the axis of the apparatus to provide a high flux density, and therefore a high plasma density, in the vicinity of a substrate disposed in this region. The plasma profile and the coating material profile within the work space are both cylindrically symmetrical, resulting in a consistent and predictable coating on substrates.

22 Claims, 13 Drawing Sheets

UNBALANCED PLASMA GENERATING APPARATUS HAVING CYLINDRICAL SYMMETRY

This application claims the benefit of U.S. Provisional Application No. 60/208,153 filed May 31, 2000.

FIELD OF THE INVENTION

The present invention relates to apparatus for generating an electric plasma under subatmospheric pressure; more particularly, to such apparatus including a magnet for producing a magnetic field in the plasma, and a sputtering cathode; and most particularly to such apparatus wherein the magnetic field is unbalanced, the sputtering cathode has cylindrical symmetry, and sputtering proceeds from a cylindrical target surface. Apparatus and methods in accordance with the invention are useful for magnetron sputtering deposition of materials on substrates and for plasma cleaning or etching of substrates.

BACKGROUND OF THE INVENTION

Cylindrical magnetron sputtering is a useful method for coating target materials onto three-dimensional complex shapes, such as the shapes of cutting tools, forming tools, biomedical devices, optical fibers, and the like. Some relevant prior art cylindrical sputtering devices using balanced magnetrons are disclosed in U.S. Pat. Nos. 3,884,793; 3,995,187; 4,030,986; 4,031,424; 4,041,353; 4,111,782; 4,116,793; 4,116,794; 4,132,612; and 4,132,613, the relevant disclosures of which are incorporated herein by reference.

In planar magnetron sputtering, a known useful method for increasing the plasma density near the substrate(s) is to use an unbalanced magnetron, wherein part of the magnetic field which normally confines electrons to the vicinity of the target in balanced magnetrons is allowed to extend away from the target surface toward the substrate on which the film is being deposited. Thus, some of the field lines that emanate from the target surface do not close back through the target surface. This allows electrons, which have high mobility in directions parallel to the magnetic field lines, to be accelerated away from the target to where they can desirably ionize the background working gas in the vicinity of the substrate. Window and Savvides first disclosed unbalanced magnetrons (*Journal of Vacuum Science and Technology* A4, 196 (1986) and *Journal of Vacuum Science and Technology* A4, 453 (1986)).

Prior art unbalanced magnetron sputtering devices deal exclusively with planar, often circular, target surfaces. The "open" or unbalanced magnetic field lines can project from either the radially outer portions or the radially inner portions of the target surface. The targets can be circular, rectangular, or any other planar shape. The magnetic polarity is also unimportant in that either the north or south magnetic pole can be used to create the open or unbalanced field lines in all cases. In one common design, several unbalanced magnetron cathodes are used in concert to form a plasma trap surrounding the substrate (s). Such devices are taught in U.S. Pat. Nos. 5,196,105 and 5,556,519. This multiple cathode arrangement is particularly beneficial in large coaters used to deposit hard and corrosion resistant materials. Most often the higher plasma densities produced by unbalanced magnetron sputtering are utilized by applying a negative electrical bias to the substrate, which bias accelerates ions toward the growing film with resulting improvements in density, composition and microstructure. Therefore, the highest possible ionization density is generally desirable.

Prior art cylindrical magnetrons use any of a variety of means to create traps for the secondary electrons produced by ion bombardment of the target, which electrons are responsible for maintaining the plasma. Some traps are formed by axial magnetic fields working together with electrostatic wings, and others are created by the magnetic field together with the surface of the electrode. Examples of such traps are described in the referenced patents.

As in planar magnetron sputtering, any of the applications for which cylindrical magnetron sputtering is particularly well-suited, such as coatings for wear and corrosion resistance and dense dielectric coatings, can benefit from a high level of ionization in the vicinity of the part(s) being coated. This permits the effective use of substrate bias or creates a level of self-bias on non-conducting substrates that improves the physical properties of the deposited film through controlled levels of ion bombardment. However, prior art cylindrical magnetrons purposely confine the plasma to the vicinity of the target surface to enhance rates of removal of material from the target, and consequently the plasma density near the depositional substrate is reduced.

SUMMARY OF THE INVENTION

The present invention relates to an improvement in plasma generating equipment for creating high plasma densities in the vicinity of a substrate. An important application is in magnetron sputter deposition onto a substrate when aided by ion bombardment of the substrate. However, we have found also that cylindrical plasma generating devices described in accordance with the present invention may be useful for other applications, such as for cleaning or etching a substrate and for creating high intensity light emission.

In conventional planar unbalanced magnetron coating devices, the unbalanced flux lines emanating from the target surface either diverge, causing the plasma to grow weaker, or are captured by opposite-polarity magnets across the working space, forming a magnet "linkage." In contrast, the unbalanced flux lines emanating from cylindrical magnetrons in accordance with the present invention cannot be captured across the working space, because the magnets are also cylindrical, and instead converge toward the axis of the cylinder to provide a high flux density, and therefore a high plasma density, in the vicinity of a substrate disposed in this region. In prior art sputter deposition, substrates being coated may be exposed to non-uniform regions of plasma and coating material as they move through a sputtering chamber. In sputter deposition in accordance with the present invention, the plasma profile and the coating material profile are both cylindrically symmetrical, resulting in a consistent and predictable coating on substrates.

BRIEF DESCRIPTION OF THE DRAWINGS

The foregoing and other objects, features, and advantages of the invention, as well as presently preferred embodiments thereof, will become more apparent from a reading of the following description in connection with the accompanying drawings in which.

DETAILED DESCRIPTION OF THE INVENTION

The benefits of the present invention may be more fully appreciated by first considering prior art cylindrical and planar magnetrons.

Figure 1:
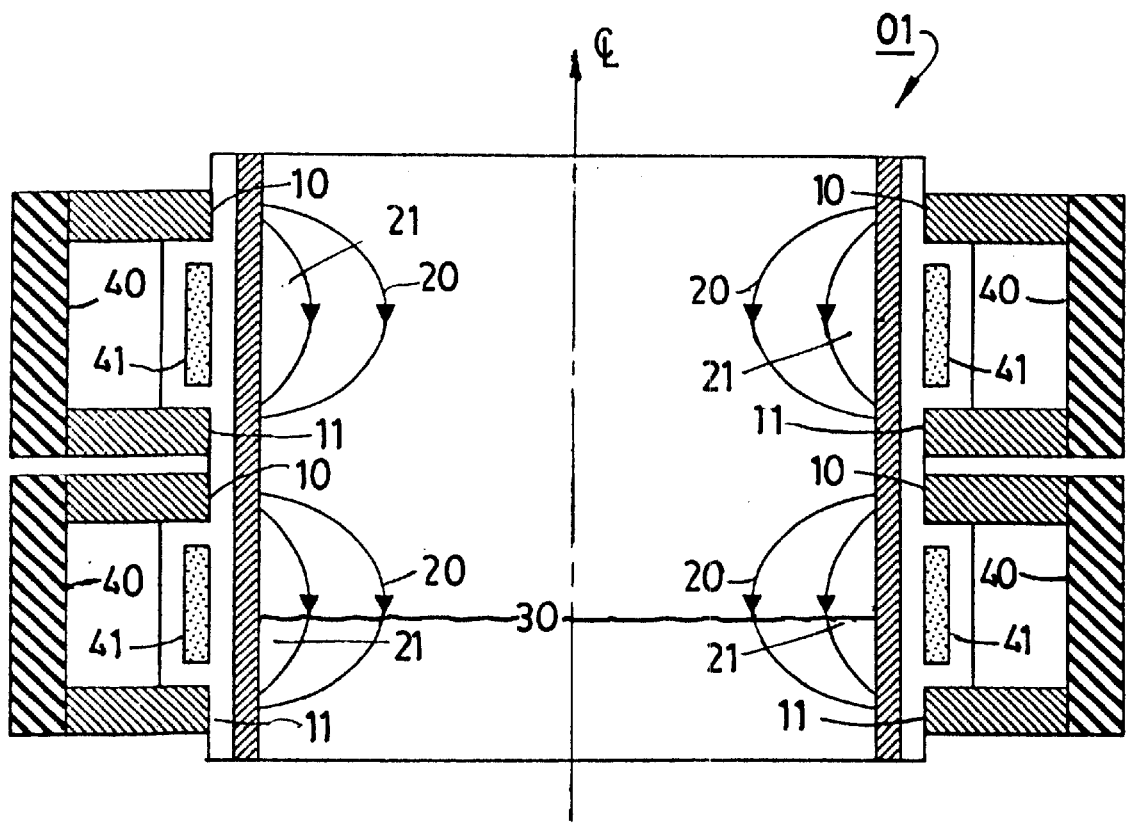
FIG. 1 is a cross-sectional view of a prior art balanced cylindrical magnetron coating device having plasma traps defined by the magnetic fields and the target surface, the view being taken along a plane including the cylinder axis.

Referring to FIG. 1, a pair of prior art balanced cylindrical magnetrons 01 have cylindrical symmetry about axis CL. Rings of magnets 10 and 11 having opposite polarities and radially directed pole faces create magnetic field lines 20. These field lines intersect the inner surface of a cylindrical target 30, common to both magnetrons, to be sputtered. The field lines create traps for the secondary electrons that are emitted under ion bombardment of the target. In the art, it is said that field lines 20 form "magnetic tunnels" 21 over the surface of the target 30 to create plasma traps adjacent to the surface of target 30. As is known in the prior art, it is possible to form more than one ring-shaped magnetic tunnel 21, thereby creating more than one trap for substantially all of the secondary electrons in this way.

In the prior art, substantially all of the field lines leaving the first poles 10 of a set of magnets close through the opposite poles 11 of the same magnets. Such magnetrons are said to be "balanced," in which condition magnets 10 and 11 have equal pole strengths. Optional soft iron keepers 40 can make the magnetic circuit more effective. Water channels 41 may be used to keep the target 30 cool during operation. Additional elements necessary for creating a plasma, such as a vacuum chamber, gas handling equipment, pumps, power supplies, and the like are not shown but will be readily inferred by those skilled in the art.

Figure 2:
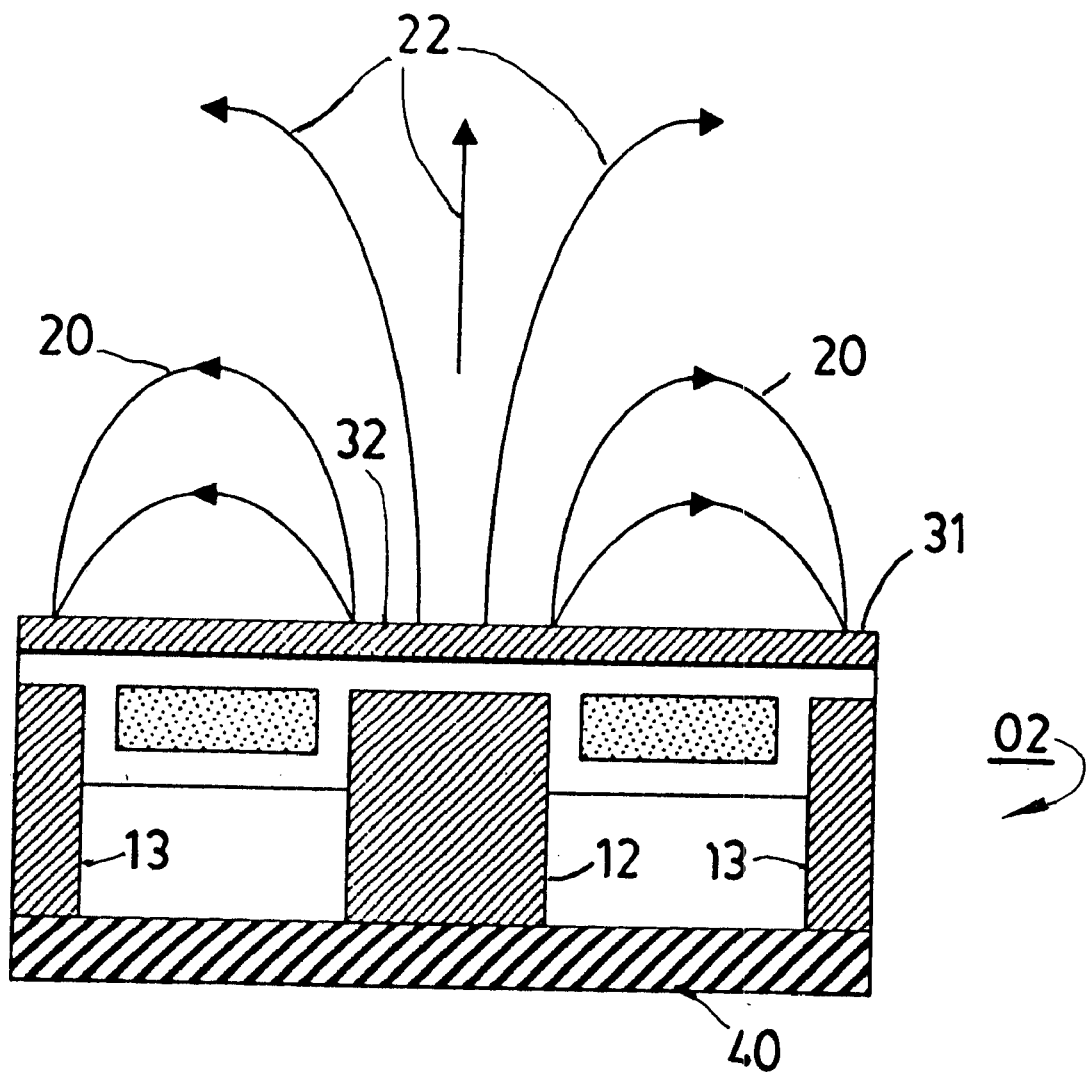
FIG. 2 is a cross-sectional view of a prior art unbalanced planar magnetron substantially as disclosed by Window and Savvides.

Referring to FIG. 2, a planar prior art magnetron 02 has magnets 12 and 13 which create closed magnetic field lines 20 that intersect the surface 31 of planar target 32 and thereby form a plasma trap, as in a balanced magnetron. However, in this case one magnet (12) has an excess pole strength compared to the other magnet (13), so that, additionally, some magnetic field lines 22 project away from the target surface above pole 12 and extend away from the target and therefore may extend toward the surface of a substrate to be coated (not shown). Field lines 22 are often referred to as "open" field lines. Prior art magnetron 02 is said to be "unbalanced." The purpose of unbalancing a magnetron is to increase the plasma density in the vicinity of the substrate being coated, often in order to use ion bombardment to enhance the properties of the film being deposited. The excess pole strength may be central to the magnets as shown, or peripheral.

Figure 3:
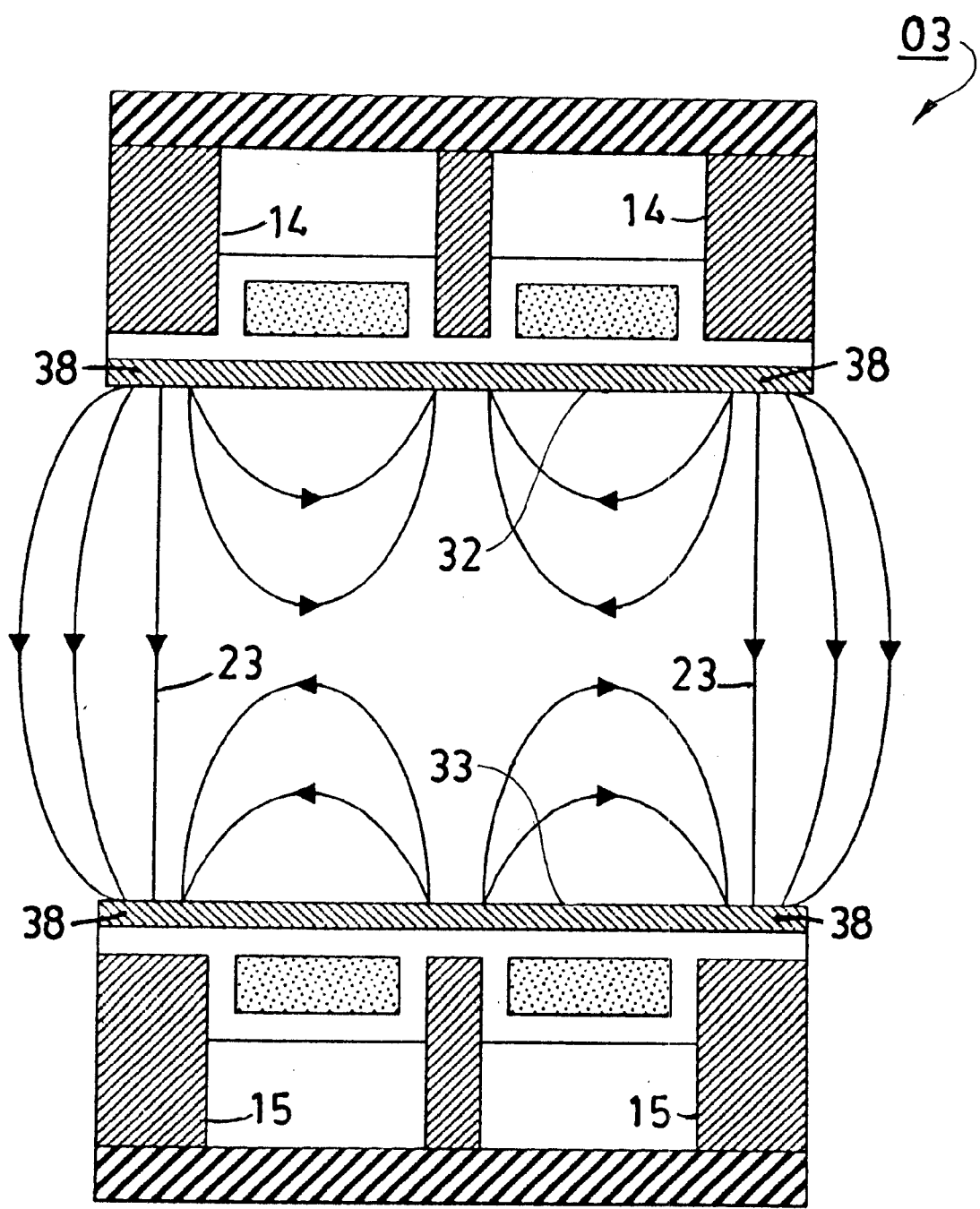
FIG. 3 is a cross-sectional view of two unbalanced planar magnetrons as disclosed in the prior art, wherein the unbalanced flux lines are closed in, or "linked" to, the opposite magnetron to form a plasma trap therebetween.

Referring to FIG. 3, another prior art magnetron arrangement 03 employs two planar unbalanced magnetron cathodes 32,33 geometrically opposed to each other and magnetically linked to create a high-density plasma between them, substantially as disclosed in U.S. Pat. No. 5,196,105. In this case, both cathodes have the excess pole strength magnets 14 and 15 on their peripheries 38. However, magnet sets 14 and 15 have opposite magnetic polarities so that some field lines 23 that leave the excess pole strength magnets 14 of one cathode enter the excess pole strength magnets 15 of the opposite cathode. This arrangement, referred to in the prior art as magnetic "linkage" (see U.S. Pat. No. 5,556,519) is known to produce a high density plasma between the cathodes, creating a very effective environment for plasma-enhanced deposition. Similar arrangements of three or more unbalanced magnetrons acting cooperatively are known in the art cited previously.

Figure 4:
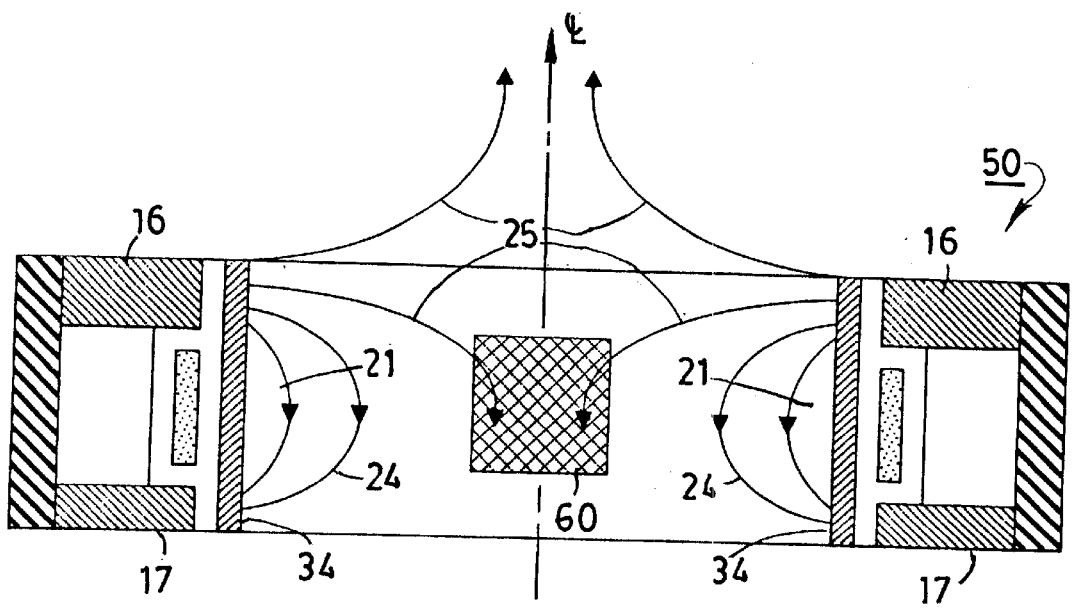
FIG. 4 is a cross-sectional view of a first unbalanced cylindrical magnetron in accordance with the present invention, which is useful for sputtering material from the inside surface of a cylindrical target onto a substrate during simultaneous high levels of substrate ion bombardment; the shown magnetron also can be operated under conditions which produce an intense plasma for cleaning or etching of a substrate or for atomic emission of electromagnetic radiation.

Referring to FIG. 4, a first embodiment 50 of an unbalanced cylindrical magnetron in accordance with the present invention is shown as it may be used for sputter deposition of target material onto substrate 60. In this embodiment, rings of permanent magnets 16 and 17, similar to prior art ring magnets 10,11, create field lines 24 that work together with the surface of the cylindrical sputtering target 34 to form an axially symmetrical plasma trap by means of magnetic tunnel 21, as in the prior art. However, magnet ring 16 has a greater pole strength than magnet ring 17, thereby creating open field lines 25 that project inwardly toward and outwardly away from the substrate 60 to be coated. This is an unbalanced magnetron. However, unlike the case of prior art planar unbalanced magnetrons, the field lines 25 which are converging radially toward the centerline CL of the coating volume produce an extremely high-density plasma in the coating environment around the substrate. Importantly, there is no magnetic linkage between opposite or adjacent pole faces, as there is in the planar prior art, as shown in FIG. 3, nor can there be because the opposite pole faces are part of the same ring magnet and therefore must have the same polarity.

Figure 5:
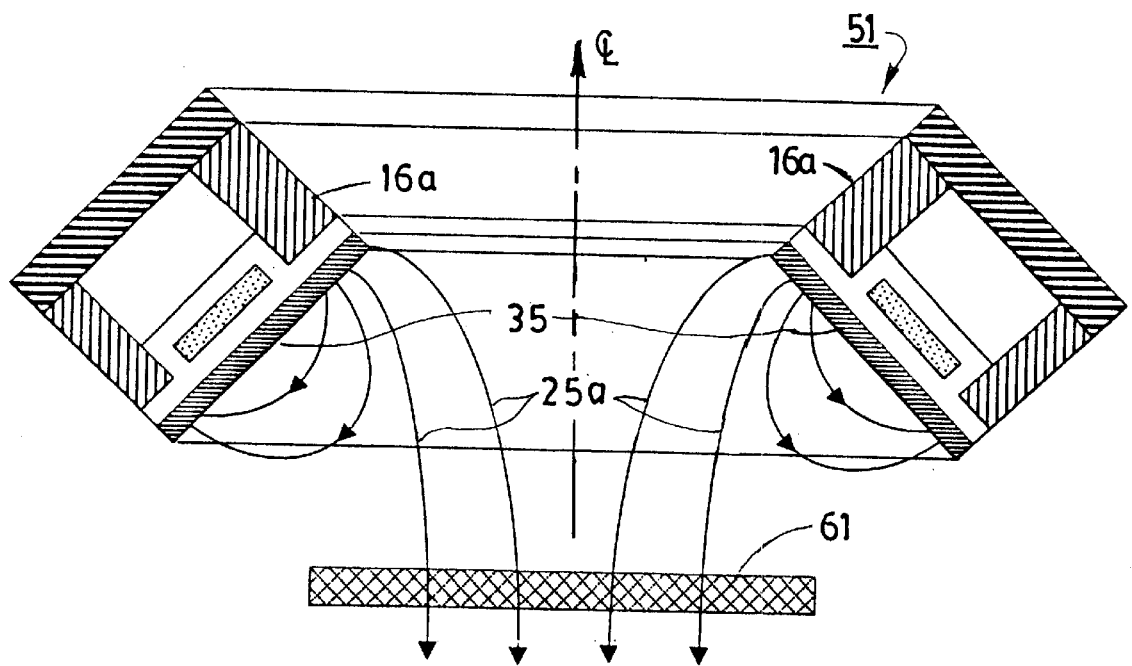
FIG. 5 is a cross-sectional view of a conical unbalanced magnetron in accordance with the present invention.

Referring to FIG. 5, a second embodiment 51 of an unbalanced magnetron in accordance with the present invention includes a conical frustum target 35 used to coat the surface of a planar substrate 61. Although target 35 is conical rather than cylindrical, the plasma profile and the coating material profile are both axially symmetrical about centerline CL. Field lines 25a produced by the excess pole strength magnets 16a project toward the substrate surface in a manner producing a high plasma density in the vicinity of the substrate. In FIG. 5, the excess pole strength magnets are located at the narrow end of the frusto-conical target, but alternatively they may instead be located at the wide end. As in embodiment 50, the field lines 25a converge radially toward centerline CL.

Figure 6:
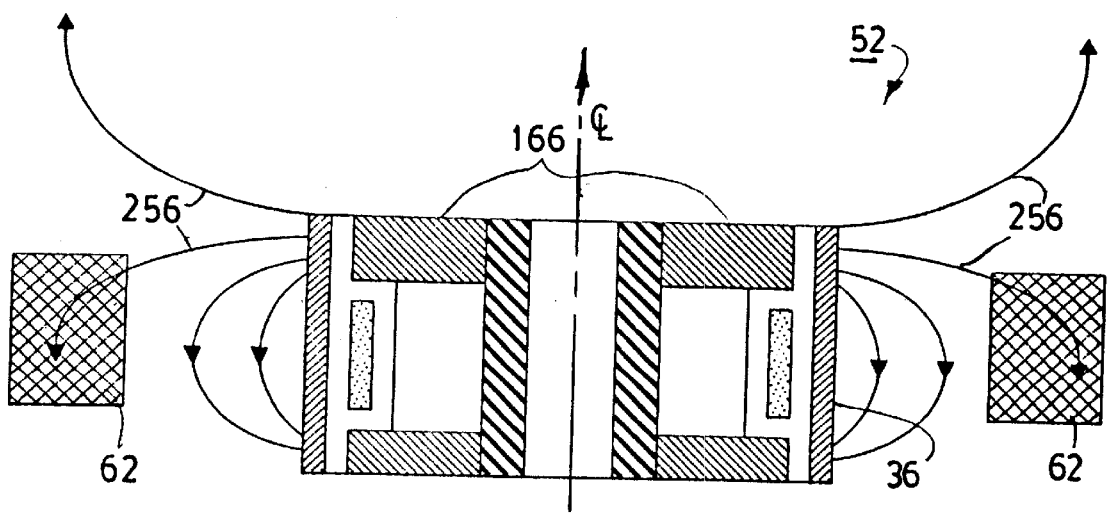
FIG. 6 is a cross-sectional view of an unbalanced cylindrical magnetron in accordance with the invention wherein material may be sputtered from the outer surface of a cylindrical target for deposition onto one or more substrates disposed radially outside the target.

Referring to FIG. 6, a third embodiment 52 of an unbalanced cylindrical magnetron in accordance with the present invention provides sputtering from the outside surface of a cylindrical target 36. In this case, the excess pole strength ring magnets 16b produce open field lines 25b that project outwardly toward and away from the substrate 62 to be coated.

Figure 7:
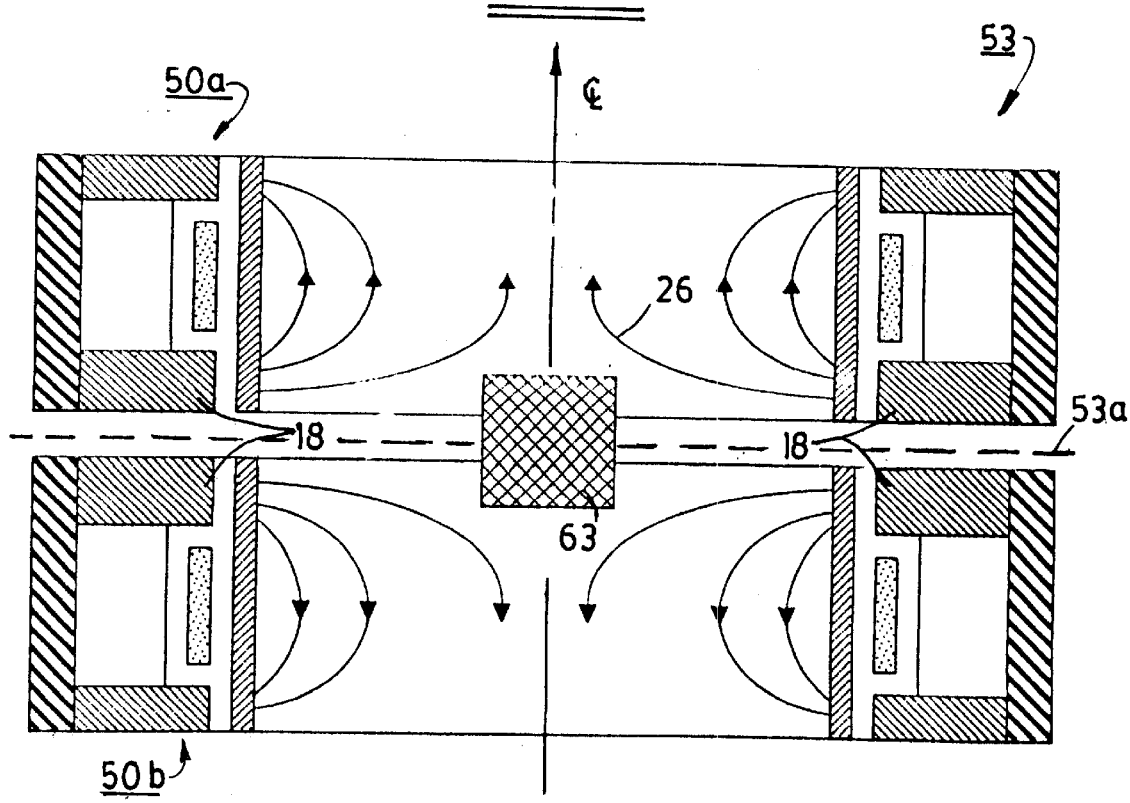
FIG. 7 is a cross-sectional view showing two unbalanced cylindrical magnetron plasma generating devices in accordance with the present invention, wherein the unbalanced poles of each magnetron are of the same polarity and are axially proximal to create a symmetric high-density plasma.

Referring to FIG. 7, a fourth embodiment 53 of an unbalanced cylindrical magnetron arrangement in accordance with the present invention includes first and second individual unbalanced cylindrical magnetrons 50a,50b, similar to magnetron 50 shown in FIG. 4, cooperating to form a dense plasma that is essentially symmetrical about a plane 53a extending between the two magnetrons, as well as being symmetrical about centerline CL. In this case the excess pole strength magnets 18 are proximal to one another and have the same magnetic polarity, creating field lines 26. Device 53 when used for sputter deposition can produce intense ion bombardment of the substrate 63 being coated.

Figure 8:
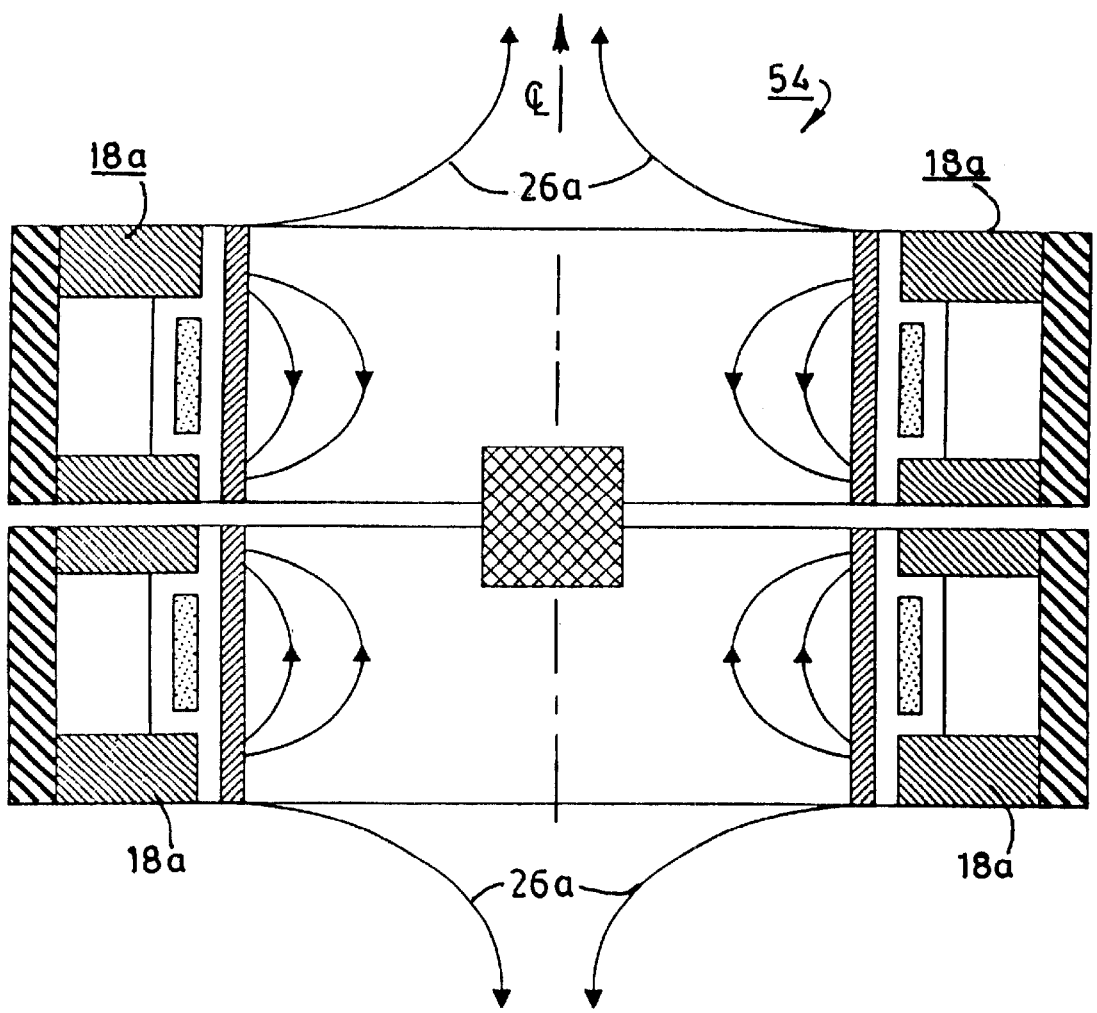
FIG. 8 is a cross-sectional view similar to that shown in FIG. 7, wherein the unbalanced poles of each magnetron are of the same polarity and are axially distal to create a symmetric high density plasma.

Referring to FIG. 8, a fifth embodiment 54 of an unbalanced cylindrical magnetron arrangement in accordance with the invention is similar to embodiment 53 as shown in FIG. 7, but the excess pole strength magnets 18a are arranged distally from one another. This creates field lines 26a that produce a less dense plasma than does the arrangement in FIG. 7; however, the plasma is nonetheless more dense than the plasma produced by prior art balanced cylindrical magnetron 01. Disposing the higher pole strength magnets proximally, as shown in FIG. 7, or distally, as shown in FIG. 8, is one means of controlling the plasma density, depending on the particular requirements of the process.

Figure 9:
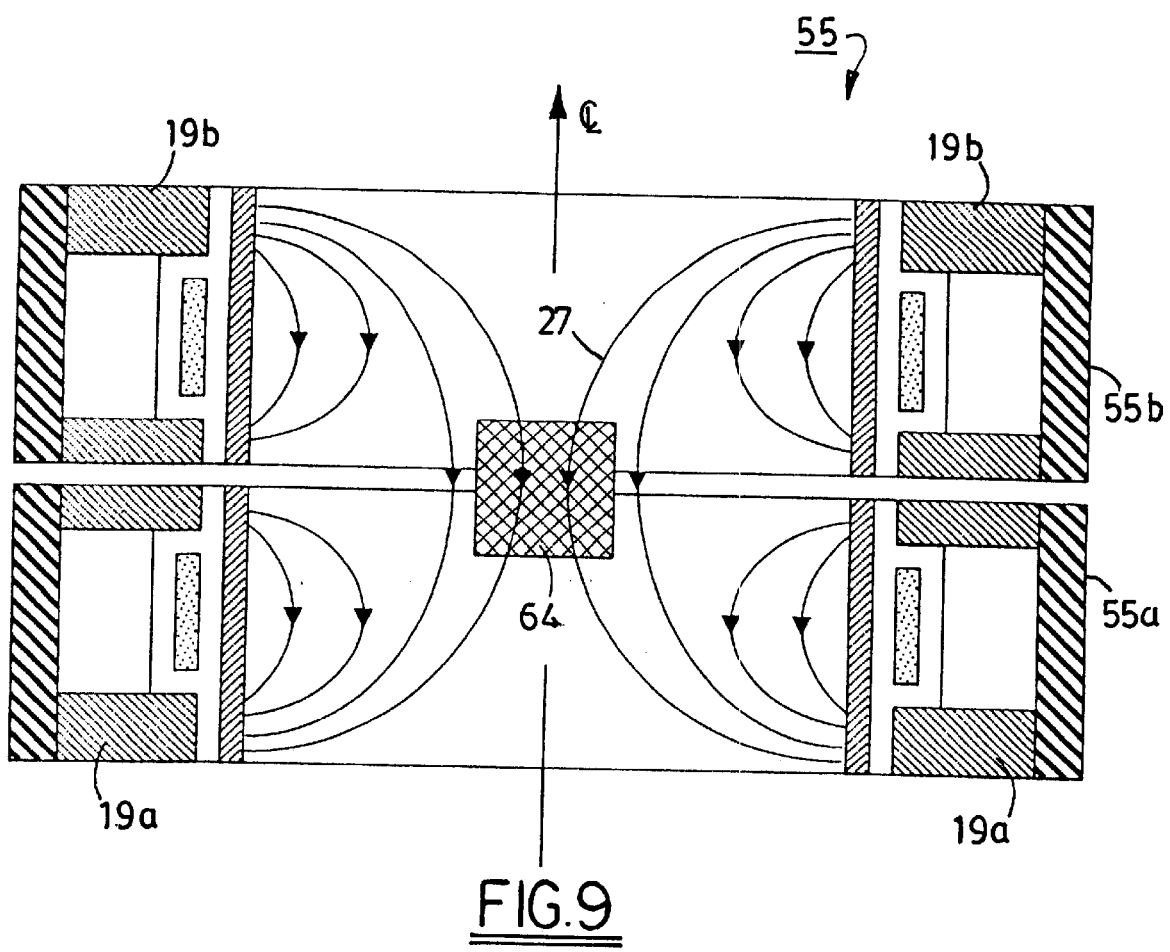
FIG. 9 is a cross-sectional view similar to that shown in FIG. 8, wherein the unbalanced poles of each magnetron are of opposite polarity and are axially distal to create an alternative type of high density plasma.

In FIGS. 7 and 8, the excess pole strength magnets have the same polarity. Referring to FIG. 9, a sixth embodiment 55 of an unbalanced cylindrical magnetron arrangement in accordance with the present invention employs two unbalanced cylindrical magnetrons 55a,55b having excess pole strength magnets 19a,19b of opposite polarities arranged distally from one other. This arrangement produces magnetic field lines 27 that close between the two unbalanced magnetrons in cylindrical "linkage" within the coating volume to form an intense axial field in the vicinity of substrate 64 to be coated. Unlike prior art multiple planar unbalanced magnetron systems, the field lines from the excess pole strength magnets 19a and 19b in a cylindrical magnetron system do not connect adjacent or opposite pole faces.

The individual cathodes shown in FIGS. 7, 8, and 9 may be electrically isolated from one another and driven with conventional independent sputtering power supplies (not shown) or they can be driven in pairs with an AC power supply operating between them, as is well known in the art. Furthermore, the targets used in the individual cathodes of multiple-cathode arrangements may be made from the same material or from different materials, which broadens significantly the choice of compositions to be deposited. It should be noted that the electrical connections and circuitry required to energize all of the cathodes shown herein are well known in the art and are fully disclosed in the incorporated references.

Figure 10:
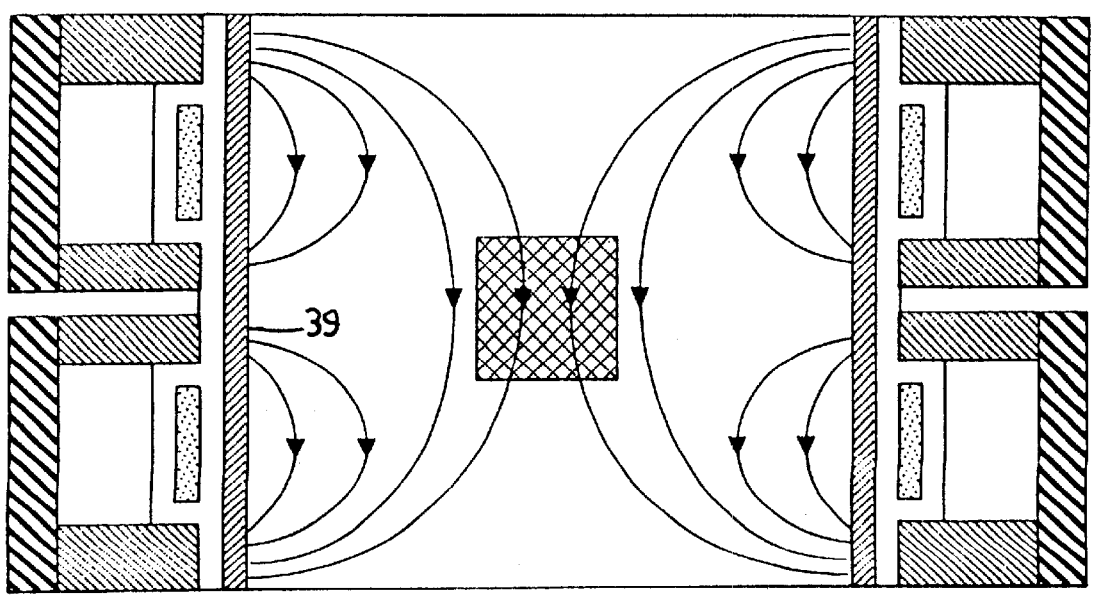
FIG. 10 is a cross-sectional view similar to that shown in FIG. 9, wherein the target is a single cylindrical electrode for two adjacent magnetrons.

The arrangements shown in FIGS. 7, 8 and 9 demonstrate that two or more unbalanced cylindrical magnetrons, each having an independent electrode, can be used together to form a variety of plasma traps. Referring to FIG. 10, it is seen that, in each case, the same variety of plasma traps can be formed using a single electrode 37 for a plurality of magnetrons.

Figure 11:
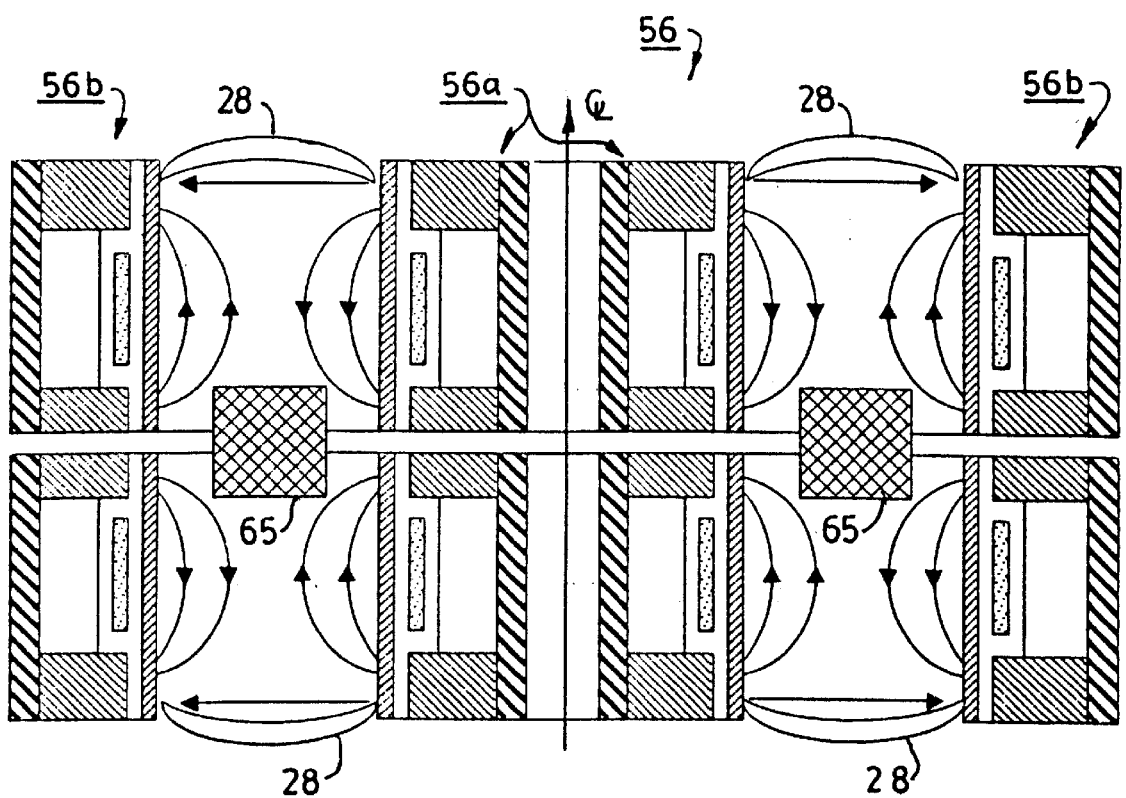
FIG. 11 is a cross-sectional view of another embodiment in accordance with the invention having two sets of unbalanced cylindrical magnetrons, each magnetron having inner and outer concentric ring magnets and inner and outer cylindrical targets disposed in an annular space between the magnets, thereby providing an annular sputtering space between the cylindrical targets.

Referring to FIG. 11, a seventh embodiment 56 of an unbalanced cylindrical magnetron arrangement in accordance with the invention employs first and second sets 56a,56b of unbalanced cylindrical magnetrons for coating one or more substrates 65. The inner set 56a is made up of two cathodes that sputter off of the outside of first cylindrical targets, similar to the arrangement shown in FIG. 6. The outer set 56b is made up of two cathodes that sputter off of the inside of second cylindrical targets, similar to the arrangement shown in FIG. 8. The two sets of magnets are arranged so that the excess pole strength magnets in outer set 56b have the opposite polarity of the excess pole strength magnets in inner set 56a. Therefore, field lines 28 extend between the two sets of magnets to form a plasma trap that encloses the annular space between the inner and outer cathodes. In this arrangement, substrate(s) 65 to be coated are surrounded by concentric sputtering targets and are enclosed in a high-density plasma around them.

Figure 12:
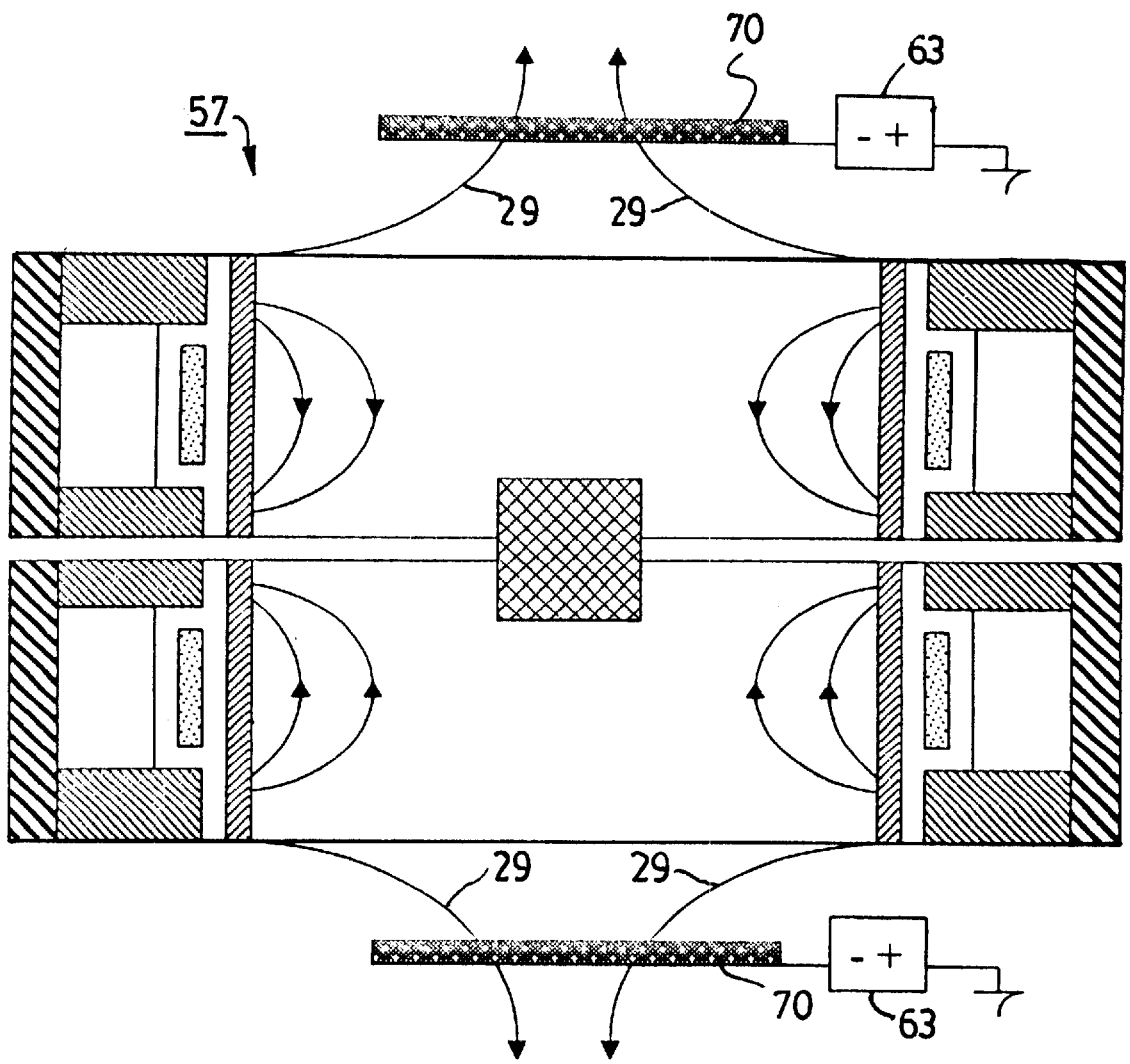
FIG. 12 is a cross-sectional view like that shown in FIG. 8, showing the addition of electrostatic deflection means to reflect secondary electrons back into the plasma region.

Referring to FIG. 12, an unbalanced cylindrical magnetron arrangement 57 similar to that shown in FIG. 8 employs reflective elements 70 to reflect the electrons back along the field lines 29 rather than allowing them to escape to grounded surfaces. Elements 70 can be separate elements or they can be part of the structure that supports the substrate(s) being coated. Elements 70 may be formed of a dielectric material, for example glass, which is charged by electron bombardment and becomes reflective of further bombardment; or element 70 may be formed of an electrical conductor and may be appropriately biased as by a power supply 63.

Figure 13:
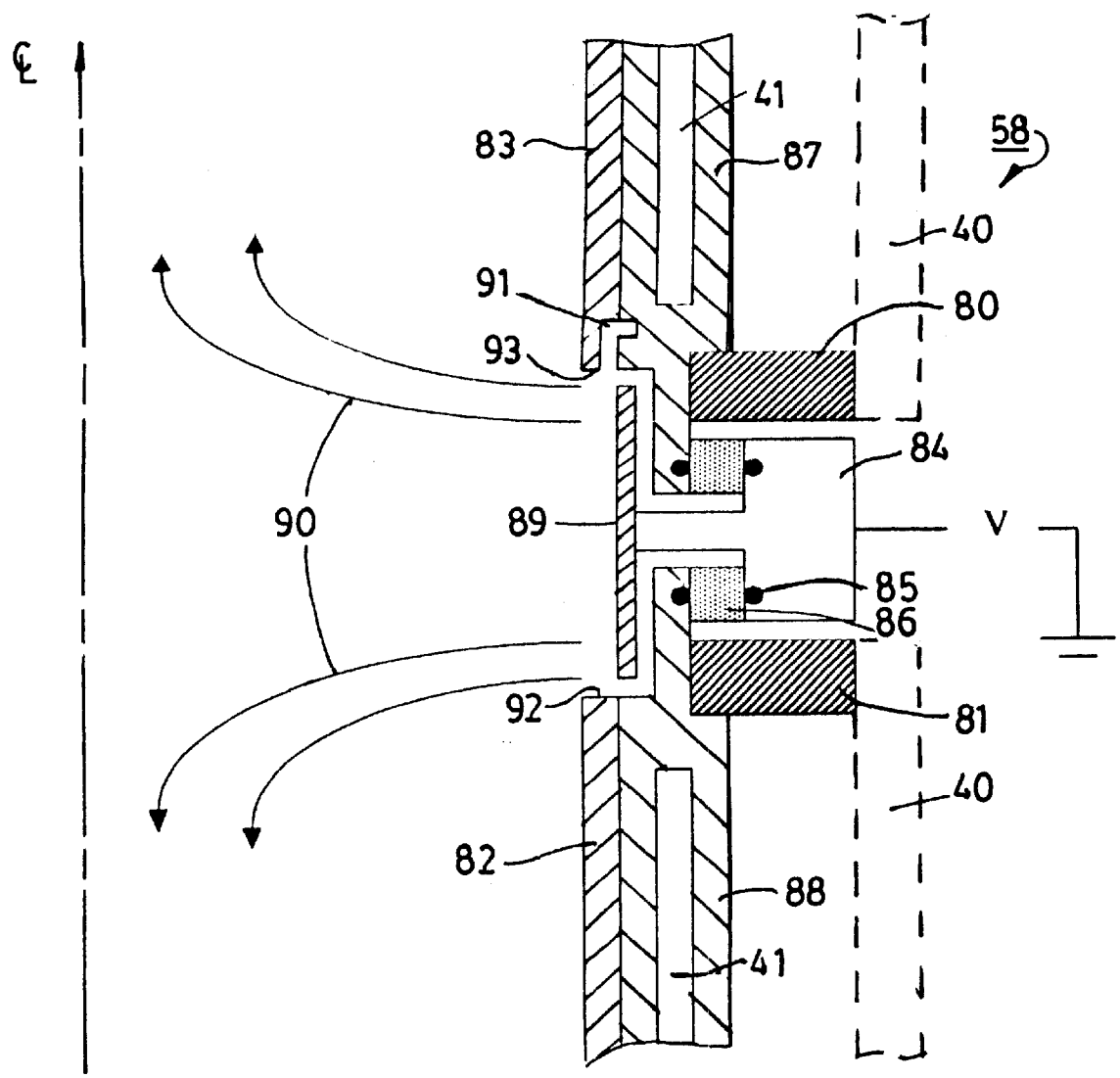
FIG. 13 is a cross-sectional view of a pair of unbalanced cylindrical magnetron plasma sources in accordance with the present invention which use an auxiliary electrode to control the energy of the secondary electrons that generate a dense plasma.

Referring to FIG. 13, a ninth embodiment 58 of an unbalanced cylindrical magnetron arrangement in accordance with the present invention is illustrated as a sputter coating device. We have found that the rate of sputtering removal of material from the target surface adjacent the magnet pole faces is very low and in fact can be negative (material deposits in these regions). Therefore, target material in this area may not consumed, and the surface of the target may become distorted. FIG. 13 shows a cathode formed in such a way that excess pole strength magnets 80 and 81 are positioned to extend axially beyond the edges 92,93 of cylindrical targets 82 and 83. A spacer ring 84 is electrically isolated from the cathodes 87 and 88 by insulators 86 and vacuum seals are formed with o-rings in a design that will be readily understood by those skilled in the art. An auxiliary electrode 89 is in contact with ring a dark space shield. Most of the unbalanced lines of magnetic flux 90 emanate from the surface of auxiliary electrode 89. This enables electrode 89 to be biased electrically in order to optimize the energy of the electrons entering the plasma, as described in U.S. Pat. No. 6,224,725 issued May 1, 2001, herein incorporated by reference. If the inside diameter of electrode 89 is greater than the inside diameter of electrodes 87 and 88, targets 82 and 83 can be held in place with devices such as retaining ring 91.

As will be apparent to those skilled in the art, the polepiece polarity of the excess pole strength magnets in all of the embodiments shown in FIGS. 4 through 13 can be either the magnetic north or magnetic south pole. Furthermore, the magnetic pole strengths can be adjusted conventionally by selecting the appropriate volume and type of magnetic material and/or through use of electromagnets or other auxiliary field producing elements. It will be further apparent to those skilled in the art that, within the scope of the invention, a plurality of unbalanced cylindrical magnetrons may be collectively disposed, coaxially or otherwise, without limit as to number nor as to which pole of each magnetron has the higher strength, to provide a particularly desired plasma.

The benefits and advantages of unbalanced cylindrical magnetron arrangements in accordance with the invention may also be illustrated by the following examples.

EXAMPLE 1

A sputtering device as shown in FIG. 7, with an inside diameter of 19 cm, was used to sputter a cylindrical titanium-aluminum alloy. The two electrodes were driven with a mid-frequency power supply operating at 40 kHz connected between them. The magnetic fields were produced using rings made up of small neodymium iron permanent magnets. The proximal magnet rings 18 had a higher number of permanent magnets in them than did the distal rings in order to produce the excess pole strength in the proximal rings. The maximum magnetic field strength parallel to the target surface was approximately 380 Gauss. Argon gas was used at sputtering pressures of 1 and 10 mTorr. Sputtering powers of 1 and 3 kW were used. A plasma probe with an area of 13.3 cm$^2$ was used to measure the ion current drawn to the probe as a function of sputtering conditions.

Figure 14:
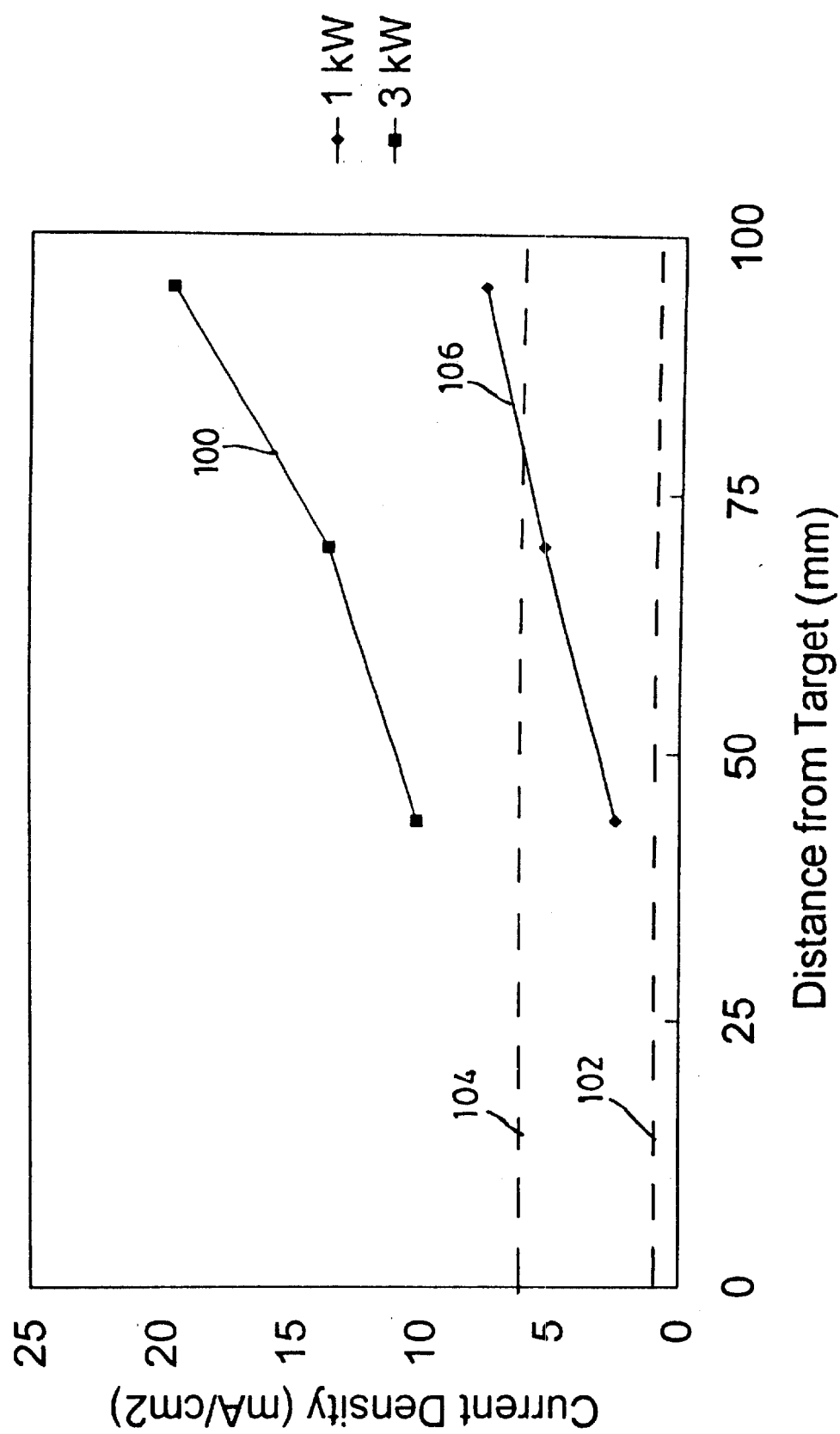
FIG. 14 is a graph of bias current density, which is proportional to plasma density, drawn by a plasma probe at two different plasma powers and at various distances from the sputtering target in a representative sputtering apparatus in accordance with the invention.
Figure 15:
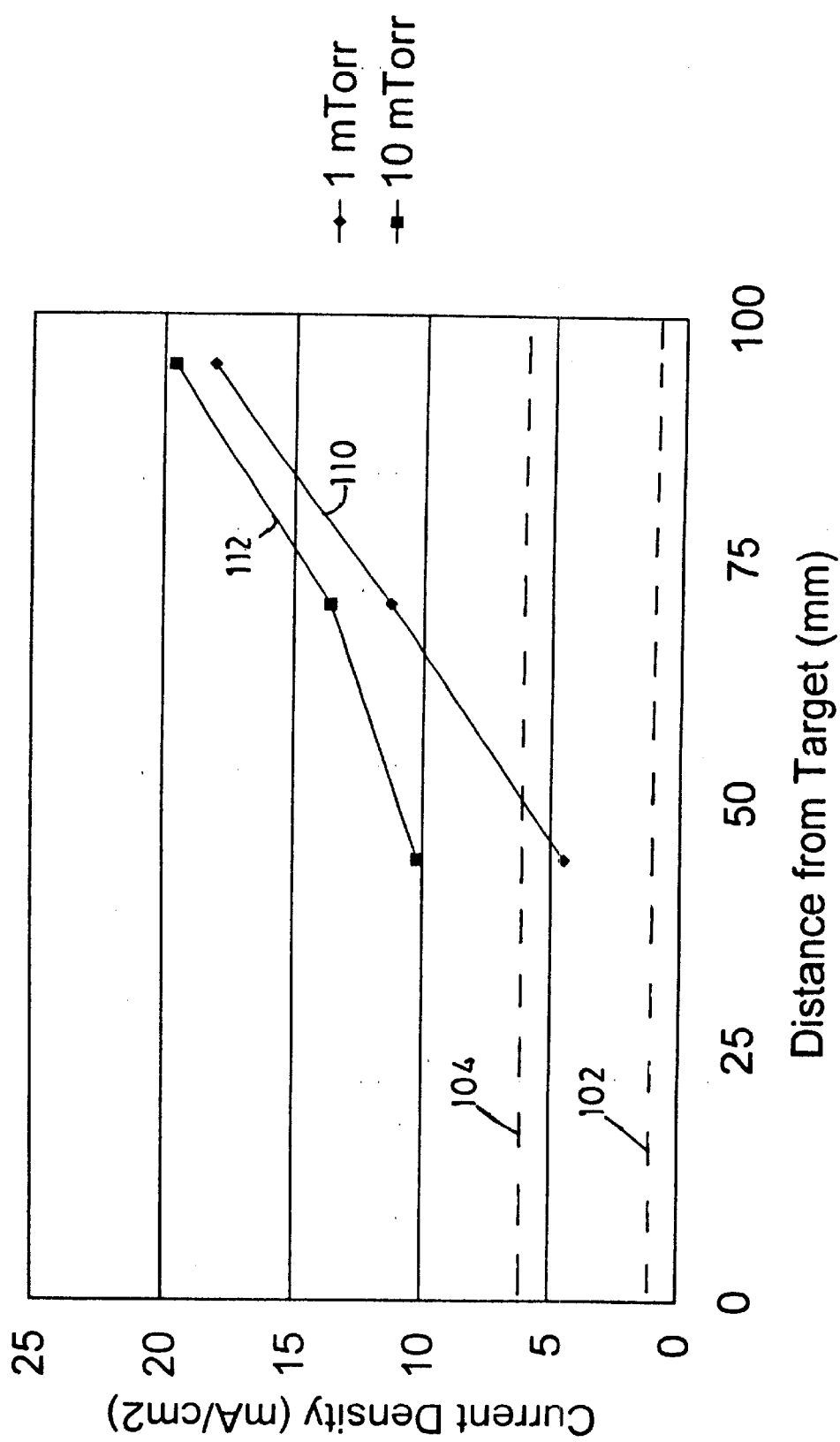
FIG. 15 is a graph similar to that shown in FIG. 14 showing the bias current density drawn by a plasma probe at two different plasma pressures.

FIG. 14 is a plot of the probe current density as a function of the distance of the probe from the target surface. The pressure was 10 mTorr, the probe bias voltage was −10 V, and cathode powers were 1 kW and 3 kW. Maximum current densities between about 1 and 6 mA/cm$^2$ (curves 102 and 104, respectively) are typical for prior art planar unbalanced magnetrons at various locations within the coating zone. It is seen (curves 106,108) that magnetrons in accordance with the invention can provide current density increases of 100% or more over prior art densities. FIG. 15 shows the results of varying the pressure in Example 1 at a cathode power of 3 kW. Extremely high current densities are possible, even at low pressures (curves 110,112).

EXAMPLE 2

We have found that the device described in Example 1 can operate at very low pressures, down to 0.5 mTorr or less, even at high powers. Surprisingly, we have found that when operating at an argon pressure of 0.5 mTorr and a power of 3 kW, the plasma aggressively etched an electrically floating substrate placed on the cathode centerline. While not being bound to the following explanation, we believe that the high energy electrons produced by the inventive device under these conditions create a sufficient difference between the plasma and floating potentials that, combined with the high plasma density, sputter erosion of the substrate occurs. Therefore, such a device is useful to produce significant plasma bombardment of electrically insulating parts, such as ceramics, glass, or plastics, which are difficult to bias normally. The ability to do this is very desirable for cleaning optical fibers, glass tows, and other widely used electrically insulating materials.

EXAMPLE 3

The optical emission of the plasma within the electrodes of the device of Example 1 was far greater than we have seen in any other magnetron sputtering device operating under similar conditions. This intense light output is consistent with the measurements and observations made in Examples 1 and 2. In many applications, such as specialized lasers and other such devices, such intense atomic emission lines from metals can be useful.

What is claimed is:

1. Apparatus for generating a plasma having cylindrical symmetry in a working gas environment, comprising:
    a) first electrode means wherein the shape of said first electrode means is selected from the group consisting of cylinder and conical frustum, said first electrode means having a surface;
    b) means for generating an unbalanced magnetic field adjacent said first electrode means, said means for generating providing excess magnetic pole strength of one polarity, a first portion of said magnetic field forming a magnetic trap adjacent said electrode surface and a second portion of said magnetic field extending away from said surface; and
    c) means for providing a voltage on said first electrode for cooperating with said magnetic field to form a plasma in said working gas,
        wherein said means for generating a magnetic field includes first and second ring magnets having opposite radial polarities and being disposed coaxially with said first electrode means and axially adjacent each other, one of said first and second ring magnets having excess pole strength relative to the other of said magnets.

2. Apparatus in accordance with claim 1 wherein said first electrode means is a first target and further comprising means for sputter depositing material from said target onto a substrate spaced apart from said electrode surface.

3. Apparatus in accordance with claim 2 further comprising means for bombarding said substrate with energetic ions during said sputter depositing.

4. An apparatus in accordance with claim 1 wherein said first electrode means has a surface in the form of a conical frustum and wherein said excess pole strength is at the wide end of said conical frustum.

5. Apparatus in accordance with claim 1 further comprising means for producing intense optical emission.

6. Apparatus in accordance with claim 1 wherein said means for providing a voltage is selected from the group consisting of DC power supply and AC power supply.

7. Apparatus in accordance with claim 1 wherein said first electrode means is a cylindrical cathode and further comprising a second electrode means disposed axially of said first electrode, wherein said means for providing a voltage is an AC power supply coupled between said first and second electrodes.

8. Apparatus in accordance with claim 7 wherein said AC power has a frequency between 1 kHz and 40 mHz.

9. Apparatus in accordance with claim 1 wherein such apparatus is a first apparatus, and further comprising at least one additional of such apparatus disposed axially of said first apparatus for cooperating therewith to form a plasma.

10. Apparatus in accordance with claim 9 wherein said excess pole strength magnets are axially distal.

11. Apparatus in accordance with claim 10 wherein said excess pole strength magnets are of the same polarity.

12. Apparatus in accordance with claim 10 wherein said excess pole strength magnets are of opposite polarity.

13. Apparatus in accordance with claim 9 wherein said excess pole strength magnets are axially proximal.

14. Apparatus in accordance with claim 13 wherein said excess pole strength magnets are of the same polarity.

15. Apparatus in accordance with claim 13 wherein said excess pole strength magnets are of opposite polarity.

16. An apparatus in accordance with claim 1 wherein said first electrode means has a surface in the form of a conical frustum and wherein said excess pole strength is at the narrow end of said conical frustum.

17. An apparatus in accordance with claim 1 wherein said first electrode means is cylindrical, further comprising:
   a) a second cylindrical electrode arranged concentrically with said first cylindrical electrode to form an annular space therebetween; and
   b) a second unbalanced magnetic field generating means disposed with the innermost of said first and second electrodes, a first magnetic trap being formed adjacent the inner surface of the outermost electrode and a second magnetic trap being formed adjacent the outer surface of the innermost electrode;
   wherein said first and second magnetic field generating means have excess pole strengths of opposite polarity at the same axial position.

18. Apparatus in accordance with claim 17 wherein at least two pairs of concentric electrodes are arranged coaxially.

19. Apparatus in accordance with claim 1 further comprising electron reflective means disposed at the axial ends of said cylindrical electrode means to aid in confinement of said plasma within said electrode means.

20. Apparatus in accordance with claim 19 wherein said electron reflective means includes an auxiliary electrode.

21. Apparatus in accordance with claim 20 wherein said auxiliary electrode is biased electrically.

22. Apparatus for generating a plasma having cylindrical symmetry in a working gas environment, comprising:
   a) a first electrode which is cylindrical in shape and electrically isolated;
   b) at least one auxiliary electrode which overlies one end of said first electrode; and
   c) magnetic field generating means for forming a magnetic trap on the surface of said first electrode to partially confine secondary electrons emitted from the surface of said first electrode, said magnetic field generating means being unbalanced and having excess pole strength of one polarity such that some open field lines created by said magnetic field generating means project from said overlying portion of said auxiliary electrode.

* * * * *